(12) United States Patent
Ryou et al.

(10) Patent No.: US 7,054,345 B2
(45) Date of Patent: May 30, 2006

(54) ENHANCED LATERAL OXIDATION (75) Inventors: Jae-Hyun Ryou, Maple Grove, MN (US); Tzu-Yu Wang, Maple Grove, MN (US); Jin K. Kim, St. Louis Park, MN (US); Gyoungwon Park, Medina, MN (US); Hoki Kwon, Plymouth, MN (US)

(73) Assignee: Finisar Corporation, Sunnyvale, CA (US)

( * ) Notice: Subject to any disclaimer, the term of this patent is extended or adjusted under 35 U.S.C. 154(b) by 120 days.

(21) Appl. No.: 10/607,887

(22) Filed: Jun. 27, 2003

(65) Prior Publication Data
US 2004/0264531 A1 Dec. 30, 2004

(51) Int. Cl.
*H01S 5/00* (2006.01)

(52) U.S. Cl. .................... 372/45.01; 372/46.01

(58) Field of Classification Search ........... 372/46.01, 372/43.01, 75
See application file for complete search history.

(56) References Cited

U.S. PATENT DOCUMENTS

| | | | |
|---|---|---|---|
| 4,317,085 A | 2/1982 | Burnham et al. | |
| 4,466,694 A | 8/1984 | MacDonald | |
| 4,660,207 A | 4/1987 | Svilans | |
| 4,675,058 A | 6/1987 | Plaster | |
| 4,784,722 A | 11/1988 | Liau et al. | |
| 4,885,592 A | 12/1989 | Kofol et al. | |
| 4,901,327 A | 2/1990 | Bradley | |
| 4,943,970 A | 7/1990 | Bradley | |
| 4,956,844 A | 9/1990 | Goodhue et al. | |
| 5,031,187 A | 7/1991 | Orenstein et al. | |
| 5,052,016 A | 9/1991 | Mahbobzadeh | |
| 5,056,098 A | 10/1991 | Anthony et al. | |
| 5,062,115 A | 10/1991 | Thornton | |
| 5,068,869 A | 11/1991 | Wang et al. | |
| 5,079,774 A | 1/1992 | Mendez et al. | |
| 5,115,441 A * | 5/1992 | Kopf et al. ............... | 372/45 |
| 5,115,442 A | 5/1992 | Lee et al. | |
| 5,117,469 A | 5/1992 | Cheung et al. | |
| 5,140,605 A | 8/1992 | Paoli et al. | |
| 5,157,537 A | 10/1992 | Rosenblatt et al. | |
| 5,158,908 A | 10/1992 | Blonder et al. | |
| 5,212,706 A | 5/1993 | Jain | |
| 5,216,263 A | 6/1993 | Paoli | |
| 5,216,680 A | 6/1993 | Magnusson et al. | |

(Continued)

FOREIGN PATENT DOCUMENTS

DE               4240706 A1      6/1994

(Continued)

OTHER PUBLICATIONS

Banwell et al., "VCSE Laser Transmitters for Parallel Data Links", *IEEE Journal of Quantum Electronics*, vol. 29, No. 2, Feb. 1993, pp. 635-644.

(Continued)

*Primary Examiner*—Minsun O. Harvey
*Assistant Examiner*—Tuan N. Nguyen
(74) *Attorney, Agent, or Firm*—Workman Nydegger (57) ABSTRACT

A vertical cavity surface emitting laser having an oxidizable layer oxidized with enhanced lateral oxidation. The oxidation may involve adding oxygen in the form of a fluid, with or without other fluid such as water vapor, in the oxidizing environment, and/or in the layer to be oxidized. This oxidation approach may be used for layers with relatively low aluminum content such as in InP based structures, or with high aluminum content such as in GaAs based structures.

7 Claims, 9 Drawing Sheets

U.S. PATENT DOCUMENTS

| | | | |
|---|---|---|---|
| 5,237,581 A | 8/1993 | Asada et al. |
| 5,245,622 A | 9/1993 | Jewell et al. |
| 5,258,990 A | 11/1993 | Olbright et al. |
| 5,262,360 A | 11/1993 | Holonyak, Jr. et al. |
| 5,285,466 A | 2/1994 | Tabatabaie |
| 5,293,392 A | 3/1994 | Shieh et al. |
| 5,317,170 A | 5/1994 | Paoli |
| 5,317,587 A | 5/1994 | Ackley et al. |
| 5,325,386 A | 6/1994 | Jewell et al. |
| 5,331,654 A | 7/1994 | Jewell et al. |
| 5,337,074 A | 8/1994 | Thornton |
| 5,337,183 A | 8/1994 | Rosenblatt et al. |
| 5,349,599 A | 9/1994 | Larkins |
| 5,351,256 A | 9/1994 | Schneider et al. |
| 5,359,447 A | 10/1994 | Hahn et al. |
| 5,359,618 A | 10/1994 | Lebby et al. |
| 5,363,397 A | 11/1994 | Collins et al. |
| 5,373,520 A | 12/1994 | Shoji et al. |
| 5,373,522 A | 12/1994 | Holonyak, Jr. et al. |
| 5,376,580 A | 12/1994 | Kish et al. |
| 5,386,426 A | 1/1995 | Stephens |
| 5,390,209 A | 2/1995 | Vakhshoori |
| 5,396,508 A | 3/1995 | Bour et al. |
| 5,404,373 A | 4/1995 | Cheng |
| 5,412,678 A | 5/1995 | Treat et al. |
| 5,412,680 A | 5/1995 | Swirhun et al. |
| 5,416,044 A | 5/1995 | Chino et al. |
| 5,428,634 A | 6/1995 | Bryan et al. |
| 5,438,584 A | 8/1995 | Paoli et al. |
| 5,446,754 A | 8/1995 | Jewell et al. |
| 5,465,263 A | 11/1995 | Bour et al. |
| 5,475,701 A | 12/1995 | Hibbs-Brenner |
| 5,493,577 A | 2/1996 | Choquette et al. |
| 5,497,390 A | 3/1996 | Tanaka et al. |
| 5,513,202 A | 4/1996 | Kobayashi et al. |
| 5,530,715 A | 6/1996 | Shieh et al. |
| 5,555,255 A | 9/1996 | Kock et al. |
| 5,557,626 A | 9/1996 | Grodzinski et al. |
| 5,561,683 A | 10/1996 | Kwon |
| 5,567,980 A | 10/1996 | Holonyak, Jr. et al. |
| 5,568,498 A | 10/1996 | Nilsson |
| 5,568,499 A | 10/1996 | Lear |
| 5,574,738 A | 11/1996 | Morgan |
| 5,581,571 A | 12/1996 | Holonyak, Jr. et al. |
| 5,586,131 A | 12/1996 | Ono et al. |
| 5,590,145 A | 12/1996 | Nitta |
| 5,598,300 A | 1/1997 | Magnusson et al. |
| 5,606,572 A | 2/1997 | Swirhun et al. |
| 5,625,729 A | 4/1997 | Brown |
| 5,642,376 A | 6/1997 | Olbright et al. |
| 5,645,462 A | 7/1997 | Banno et al. |
| 5,646,978 A | 7/1997 | Kem et al. |
| 5,648,978 A | 7/1997 | Sakata |
| 5,679,963 A | 10/1997 | Klem et al. |
| 5,692,083 A | 11/1997 | Bennett |
| 5,696,023 A | 12/1997 | Holonyak, Jr. et al. |
| 5,699,373 A | 12/1997 | Uchida et al. |
| 5,712,188 A | 1/1998 | Chu et al. |
| 5,726,805 A | 3/1998 | Kaushik et al. |
| 5,727,013 A | 3/1998 | Botez et al. |
| 5,727,014 A | 3/1998 | Wang et al. |
| 5,774,487 A * | 6/1998 | Morgan | 372/45 |
| 5,778,018 A | 7/1998 | Yoshikawa et al. |
| 5,781,575 A | 7/1998 | Nilsson |
| 5,784,399 A | 7/1998 | Sun |
| 5,790,733 A | 8/1998 | Smith et al. |
| 5,805,624 A | 9/1998 | Yang et al. |
| 5,818,066 A | 10/1998 | Duboz |
| 5,828,684 A | 10/1998 | Van de Walle |
| 5,838,705 A | 11/1998 | Shieh et al. |
| 5,838,715 A | 11/1998 | Corzine et al. |
| 5,892,784 A | 4/1999 | Tan et al. |
| 5,892,787 A | 4/1999 | Tan et al. |
| 5,896,408 A | 4/1999 | Corzine et al. |
| 5,901,166 A | 5/1999 | Nitta et al. |
| 5,903,588 A | 5/1999 | Guenter et al. |
| 5,903,589 A | 5/1999 | Jewell |
| 5,903,590 A | 5/1999 | Hadley et al. |
| 5,908,408 A | 6/1999 | McGary et al. |
| 5,936,266 A | 8/1999 | Holonyak, Jr. et al. |
| 5,940,422 A | 8/1999 | Johnson |
| 5,953,362 A | 9/1999 | Pamulapati et al. |
| 5,978,401 A | 11/1999 | Morgan |
| 5,978,408 A | 11/1999 | Thornton |
| 5,995,531 A | 11/1999 | Gaw et al. |
| 6,002,705 A | 12/1999 | Thornton |
| 6,008,675 A | 12/1999 | Handa |
| 6,014,395 A | 1/2000 | Jewell |
| 6,043,104 A | 3/2000 | Uchida et al. |
| 6,046,065 A | 4/2000 | Goldstein et al. |
| 6,052,398 A | 4/2000 | Brillouet et al. |
| 6,055,262 A | 4/2000 | Cox et al. |
| 6,060,743 A | 5/2000 | Sugiyama et al. |
| 6,078,601 A | 6/2000 | Smith |
| 6,086,263 A | 7/2000 | Selli et al. |
| 6,133,590 A | 10/2000 | Ashley et al. |
| 6,144,682 A | 11/2000 | Sun |
| 6,154,480 A | 11/2000 | Magnusson et al. |
| 6,160,834 A * | 12/2000 | Scott | 372/96 |
| 6,185,241 B1 | 2/2001 | Sun |
| 6,191,890 B1 | 2/2001 | Baets et al. |
| 6,208,681 B1 | 3/2001 | Thorton |
| 6,212,312 B1 | 4/2001 | Grann et al. |
| 6,238,944 B1 | 5/2001 | Floyd |
| 6,269,109 B1 | 7/2001 | Jewell |
| 6,297,068 B1 | 10/2001 | Thornton |
| 6,302,596 B1 | 10/2001 | Cohen et al. |
| 6,339,496 B1 | 1/2002 | Koley et al. |
| 6,369,403 B1 | 4/2002 | Holonyak, Jr. |
| 6,372,533 B1 | 4/2002 | Jayaraman et al. |
| 6,392,257 B1 | 5/2002 | Ramdani et al. |
| 6,410,941 B1 | 6/2002 | Taylor et al. |
| 6,411,638 B1 | 6/2002 | Johnson et al. |
| 6,427,066 B1 | 7/2002 | Grube |
| 6,455,879 B1 | 9/2002 | Ashley et al. |
| 6,459,709 B1 | 10/2002 | Lo et al. |
| 6,459,713 B1 | 10/2002 | Jewell |
| 6,462,360 B1 | 10/2002 | Higgins, Jr. et al. |
| 6,472,694 B1 | 10/2002 | Wilson et al. |
| 6,477,285 B1 | 11/2002 | Shanley |
| 6,487,230 B1 | 11/2002 | Boucart et al. |
| 6,487,231 B1 | 11/2002 | Boucart et al. |
| 6,490,311 B1 | 12/2002 | Boucart et al. |
| 6,493,371 B1 | 12/2002 | Boucart et al. |
| 6,493,372 B1 | 12/2002 | Boucart et al. |
| 6,493,373 B1 | 12/2002 | Boucart et al. |
| 6,496,621 B1 | 12/2002 | Kathman et al. |
| 6,498,358 B1 | 12/2002 | Lach et al. |
| 6,501,973 B1 | 12/2002 | Foley et al. |
| 6,515,308 B1 | 2/2003 | Kneissl et al. |
| 6,535,541 B1 | 3/2003 | Boucart et al. |
| 6,536,959 B1 | 3/2003 | Kuhn et al. |
| 6,542,527 B1 * | 4/2003 | Gopinath | 372/45.01 |
| 6,542,531 B1 | 4/2003 | Sirbu et al. |
| 6,567,435 B1 | 5/2003 | Scott et al. |
| 6,845,118 B1 * | 1/2005 | Scott | 372/96 |
| 2001/0004414 A1 | 6/2001 | Kuhn et al. |
| 2002/0154675 A1 | 10/2002 | Deng et al. |
| 2003/0072526 A1 | 4/2003 | Kathman et al. |
| 2004/0151221 A1 * | 8/2004 | Yamamoto et al. | 372/32 |

FOREIGN PATENT DOCUMENTS

EP        0288184 A2    10/1988

| EP | 0776076 A1 | 5/1997 |
| JP | 60123084 | 1/1985 |
| JP | 02054981 | 2/1990 |
| JP | 5299779 | 11/1993 |
| WO | WO 98/57402 | 12/1998 |

OTHER PUBLICATIONS

Bowers et al., "Fused Vertical Cavity Lasers With Oxide Aperture", Final report for MICRO project 96-042, Industrial Sponsor: Hewlett Packard, 4 pages, 1996-97.

Catchmark et al., "High Temperature CW Operation of Vertical Cavity Top Surface-Emitting Lasers", CLEO 1993, p. 138.

Chemla et al., "Nonlinear Optical Properties of Semiconductor Quantum Wells", *Optical Nonlinearities and Instabilities in Semiconductors*, Academic Press, Inc., Copyright 1988, pp. 83-120.

Choe, et al., "Lateral oxidation of AlAs layers at elevated water vapour pressure using a closed-chamber system," Letter to the Editor, Semiconductor Science Technology, 15, pp. L35-L38, Aug. 2000.

Choa et al., "High-Speed Modulation of Vertical-Cavity Surface-Emitting Lasers", *IEEE Photonics Technology Letter*, vol. 3, No. 8, Aug. 1991, pp. 697-699.

Choquette et al., "High Single Mode Operation from Hybrid Ion Implanted/Selectively Oxidized VCSELs", 200 IEEE 17th International Semiconductor Laser Conference, Monterrey, CA pp. 59-60.

Choquette et al., "Lithographically-Defined Gain Apertures Within Selectively Oxidized VCSELs", paper CtuL6, Conference on Lasers and Electro-Optics, San Francisco, California (2000).

Choquette, et al., "VCSELs in information systems: 10Gbps$^{-1}$ oxide VCSELs for data communication", Optics In Information Systems, vol. 12, No. 1, p. 5, SPIE International Technical Group Newsletter, Apr. 2001.

Chua, et al., "Low-Threshold 1.57- μm VC-SEL's Using Strain-Compensated Quantum Wells and Oxide/Metal Backmirror," IEEE Photonics Technology Letters, vol. 7, No. 5, pp. 444-446, May 1995.

Chua, et al., "Planar Laterally Oxidized Vertical-Cavity Lasers for Low-Threshold High-Density Top-Surface-Emitting Arrays," IEEE Photonics Technology Letters, vol. 9, No. 8, pp. 1060-1062, Aug. 1997.

Cox, J. A., et al., "Guided Mode Grating Resonant Filters for VCSEL Applications", *Proceedings of the SPIE*, The International Society for Optical Engineering, Diffractive and Holographic Device Technologies and Applications V, San Jose, California, Jan. 28-29, 1998, vol. 3291, pp. 70-71.

Farrier, Robert G., "Parametric control for wafer fabrication: New CIM techniques for data analysis," Solid State Technology, pp. 99-105, Sep. 1997.

Fushimi, et al., "Degradation Mechanism in Carbon-doped GaAs Minority-carrier Injection Devices," 34th Annual IRPS Proceedings, Dallas, TX., Apr. 29-May 2, 1996, 8 pages.

G. G. Ortiz, et al., "Monolithic Integration of In0.2 GA0.8As Vertical Cavity Surface-Emitting Lasers with Resonance-Enhanced Quantum Well Photodetectors", *Electronics Letters*, vol. 32, No. 13, Jun. 20, 1996, pp. 1205-1207.

G. Shtengel et al., "High-Speed Vertical-Cavity Surface-Emitting Lasers", *Photon. Tech. Lett.*, vol. 5, No. 12, pp. 1359-1361 (Dec. 1993).

Geib, et al., "Comparison of Fabrication Approaches for Selectively Oxidized VCSEL Arrays," Proceedings of SPIE, vol. 3946, pp. 36-40, 2000.

Graf, Rudolph, *Modern Dictionary of Electronics*, 6th ed., Indiana: Howard W. Sams & Company, 1984, p. 694.

Guenter et al., "Reliability of Proton-Implanted VCSELs for Data Communications", Invited paper, SPIE, vol. 2683, OE LASE 96; Photonics West: Fabrication, Testing and Reliability of Semiconductor Lasers, (SPIE, Bellingham, WA 1996).

Guenter, et al., "Commercialization of Honeywell's VCSEL technology: further developments," Proceedings of the SPIE, vol. 4286, GSPIE 2000, 14 pages.

Hadley et al., "High-Power Single Mode Operation from Hybrid Ion Implanted/Selectively Oxidized VCSELs", 13th Annual Meeting IEEE Lasers and Electro-Optics Society 2000 Annual Meeting (LEOS 2000), Rio Grande, Puerto Rico, pp. 804-805.

Hawthorne, et al., "Reliability Study of 850 nm VCSELs for Data Communications," IEEE, pp. 1-11, May 1996.

Herrick, et al., "Highly reliable oxide VCSELs manufactured at HP/Agilent Technologies," Invited Paper, Proceedings of SPIE vol. 3946, pp. 14-19, 2000.

Hibbs-Brenner et al., "Performance, Uniformity and Yield of 850nm VCSELs Deposited by MOVPE", *IEEE Phot. Tech. Lett.*, vol. 8, No. 1, pp. 7-9, Jan. 1996.

Hideaki Saito, et al., "Controlling polarization of quantum-dot surface-emitting lasers by using structurally anisotropic self-assembled quantum dots," American Institute of Physics, Appl, Phys. Lett. 71 (5), pp. 590-592, Aug. 4, 1997.

Hornak et al., "Low-Termperature (10K-300K) Characterization of MOVPE-Grown Vertical-Cavity Surface-Emitting Lasers", *Photon. Tech. Lett.*, vol. 7, No. 10, pp. 1110-1112, Oct. 1995.

Huffaker et al., "Lasing Characteristics of Low Threshold Microcavity Layers Using Half-Wave Spacer Layers and Lateral Index Confinement", *Appl. Phys. Lett.*, vol. 66, No. 14, pp. 1723-1725, Apr. 3, 1995.

Jewell et al., "Surface Emitting Microlasers for photonic Switching & Intership Connections", *Optical Engineering*, vol. 29, No. 3, pp. 210-214, Mar. 1990.

Jiang et al., "High-Frequency Polarization Self-Modulation in Vertical-Cavity Surface-Emitting Lasers", *Appl. Phys. Letters*, vol. 63, No. 26, Dec. 27, 1993, pp. 2545-2547.

K.L. Lear et al., "Selectively Oxidized Vertical Cavity Surface-Emitting Lasers with 50% Power Conversion Efficiency", *Elec. Lett.*, vol. 31, No. 3 pp. 208-209, Feb. 2, 1995.

Kash, et al., "Recombination in GaAs at the AlAs oxide-GaAs interface," Applied Physics Letters, vol. 67, No. 14, pp. 2022-2024, Oct. 2, 1995.

Kishino et al., "Resonant Cavity-Enhanced (RCE) Photodetectors", *IEEE Journal of Quantum Electronics*, vol. 27, No. 8, pp. 2025-2034.

Koley B., et al., "Dependence of lateral oxidation rate on thickness of AlAs layer of interest as a current aperture in vertical-cavity surface-emitting laser structures", Journal of Applied Physics, vol. 84, No. 1, pp. 600-605, Jul. 1, 1998.

Kuchibhotla et al., "Low-Voltage High Gain Resonant_Cavity Avalanche Photodiode", *IEEE Phototonics Technology Letters*, vol. 3, No. 4, pp. 354-356.

Lai et al., "Design of a Tunable GaAs/AlGaAs Multiple-Quantum-Well Resonant Cavity Photodetector", *IEEE Journal of Quantum Electronics*, vol. 30, No. 1, pp. 108-114.

Lee et al., "Top-Surface Emitting GaAs Four-Quantum-Well Lasers Emitting at 0-85 um", *Electronics Letters*, vol. 24, No. 11, May 24, 1990, pp. 710-711.

Lehman et al., "High Frequency Modulation Characteristics of Hybrid Dielectric/AlGaAs Mirror Singlemode VCSELs", Electronic Letters, vol. 31, No. 15, Jul. 20, 1995, pp. 1251-1252.

Maeda, et al., "Enhanced Glide of Dislocations in GaAs Single Crystals by Electron Beam Irradiation," Japanese Journal of Applied Physics, vol. 20, No. 3, pp. L165-L168, Mar. 1981.

Magnusson, "Integration of Guided-Mode Resonance Filters and VCSELs", Electo-Optics Research Center, Department of Electrical Engineering, University of Texas at Arlington, May 6, 1997.

Martinsson et al., "Transverse Mode Selection in Large-Area Oxide-Confined Vertical-Cavity Surface-Emitting Lasers Using a Shallow Surface Relief", IEEE Photon. Technol. Lett., 11(12), 1536-1538 (1999).

Miller et al., "Optical Bistability Due to Increasing Absorption", Optics Letters, vol. 9, No. 5, May 1984, pp. 162-164.

Min Soo Park and Byung Tae Ahn, "Polarization control of vertical-cavity surface-emitting lasers by electro-optic birefringence," Applied Physics Letter, vol. 76, No. 7, pp. 813-815, Feb. 14, 2000.

Morgan et al., "200 C, 96-nm Wavelength Range, Continuous-Wave Lasing from Unbonded GaAs MOVPE-Grown Vertical Cavity Surface-Emitting Lasers", IEEE Photonics Technology Letters, vol. 7, No. 5, May 1995, pp. 441-443.

Morgan et al., "High-Power Coherently Coupled 8×8 Vertical Cavity Surface Emitting Laser Array", Appl. Phys Letters, vol. 61, No. 10, Sep. 7, 1992, pp. 1160-1162.

Morgan et al., "Hybrid Dielectric/AlGaAs Mirror Spatially Filtered Vertical Cavity Top-Surface Emitting Laser", Appl. Phys. Letters, vol. 66, No. 10, Mar. 6, 1995, pp. 1157-1159.

Morgan et al., "Novel Hibrid-DBR Single-Mode Controlled GaAs Top-Emitting VCSEL with Record Low Voltage", 2 pages, dated prior to Dec. 29, 2000.

Morgan et al., "One Watt Vertical Cavity Surface Emitting Laser", Electron. Lett., vol. 29, No. 2, pp. 206-207, Jan. 21, 1993.

Morgan et al., "Producible GaAs-based MOVPE-Grown Vertical-Cavity Top-Surface Emitting Lasers with Record Performance", Elec. Lett., vol. 31, No. 6, pp. 462-464, Mar. 16, 1995.

Morgan et al., "Progress and Properties of High-Power Coherent Vertical Cavity Surface Emitting Laser Arrays", SPIE, Vo. 1850, Jan. 1993, pp. 100-108.

Morgan et al., "Progress in Planarized Vertical Cavity Surface Emitting Laser Devices and Arrays", SPIE, vol. 1562, Jul. 1991, pp. 149-159.

Morgan et al., "Spatial-Filtered Vertical-Cavity Top Surface-Emitting Lasers", CLEO, 1993, pp. 138-139.

Morgan et al., "Submilliamp, Low-Resistance, Continuous-Wave, Single-Mode GaAs Planar Vertical-Cavity Surface Emitting Lasers", Honeywell Technology Center, Jun. 6, 1995.

Morgan et al., "Transverse Mode Control of Vertical-Cavity Top-Surface Emitting Lasers", IEEE Photonics Technology Letters, vol. 4, No. 4, Apr. 1993, pp. 374-377.

Morgan et al., "Vertical-cavity surface-emitting laser arrays", Invited Paper, SPIE, vol. 2398, Feb. 6, 1995, pp. 65-93.

Morgan et al., Vertical-cavity surface emitting lasers come of age, Invited paper, SPIE, vol. 2683, 0-8194-2057, Mar. 1996, pp. 18-29.

Morgan, "High-Performance, Producible Vertical Cavity Lasers for Optical Interconnects", High Speed Electronics and Systems, vol. 5, No. 4, Dec. 1994, pp. 65-95.

Naone R.L., et al., "Tapered-apertures for high-efficiency miniature VCSELs", LEOS newsletter, vol. 13, No. 4, pp. 1-5, Aug. 1999.

Nugent et al., "Self-Pulsations in Vertical-Cavity Surface-Emitting Lasers", Electronic Letters, vol. 31, No. 1, Jan. 5, 1995, pp. 43-44.

Oh, T. H. et al., "Single-Mode Operation in Antiguided Vertical-Cavity Surface-Emitting Laser Using a Low-Temperature Grown AlGaAs Dielectric Aperture", IEEE Photon. Technol. Lett, 10(8), 1064-1066 (1998).

Osinski, et al., "Temperature and Thickness Dependence of Steam Oxidation of AIAs in Cylindrical Mesa Structure," IEEE Photonics Technology Letters, vol. 13, No. 7, pp. 687-689, Jul. 2001.

Peck, D. Stewart, Comprehensive Model for Humidity Testing Correlation, IEEE/IRPS, pp. 44-50, 1986.

Ries, et al., "Visible-spectrum ($\lambda$=650nm) photopumped (pulsed, 300 K) laser operation of a vertical-cavity AIAs-AIGsAs/InGaP quantum well heterostructure utilizing native oxide mirrors," Applied Physics Letters, vol. 67, No. 8, pp. 1107-1109, Aug. 21, 1995.

S.S. Wang and R. Magnusson, "Multilayer Waveguide-Grating Filters", Appl. Opt., vol. 34, No. 14, pp. 2414-2420, 1995.

S.S. Wang and R. Magnusson, "Theory and Applications of Guided-Mode Resonance Filters", Appl. Opt., vol. 32, No. 14, pp. 2606-2613, 1993.

Sah, et al., "Carrier Generation and Recombination in P-N Junctions and P-N Junction Characteristics," Proceedings of the IRE, pp. 1228-1243, Sep., 1957.

Schubert, "Resonant Cavity Light-Emitting Diode", Appl. Phys. Lett., vol. 60, No. 8, pp. 921-23, Feb. 24, 1992.

Shi, et al., "Photoluminescence study of hydrogenated aluminum oxide-semiconductor interface," Applied Physics Letters, vol. 70, No. 10, pp. 1293-1295, Mar. 10, 1997.

Smith, R.E. et al., Polarization-Sensitive Subwavelength Antireflection Surfaces on a Semiconductor for 975 NM, Optics Letters, vol. 21, No. 15, Aug. 1, 1996, pp. 1201-1203.

Spicer, et al., "The Unified Model For Schottky Barrier Formation and MOS Interface States in 3-5 Compounds," Applications of Surface Science, vol. 9, pp. 83-101, 1981.

Suning Tang et al., "Design Limitations of Highly Parallel Free-Space Optical Interconnects Based on Arrays of Vertical Cavity Surface-Emitting Laser Diodes, Microlenses, and Photodetectors", Journal of Lightwave Technology, vol. 12, No. 11, Nov. 1, 1994, pp. 1971-1975.

T. Mukaihara, "Polarization Control of Vertical-cavity Surface-Emitting Lasers by a Birefringent Metal/Semiconductor Polarizer Terminating a Distributed Bragg Reflector," Tokyo Institute of Technology, Precision and Intelligence Laboratory, pp. 183-184.

Tao, Andrea, "Wet-Oxidation of Digitally Alloyed AIGaAs," National Nanofabrication Users Network, Research Experience for Undergraduates 2000, 2 pages.

Tautm, et al., Commerialization of Honeywell's VCSEL Technology, Published in Proceedings fo the SPIE, vol. 3946, SPI, 2000, 12 pages.

Tshikazu Mukaihara, et al., "A Novel Birefringent Distributed Bragg Reflector Using a Metal/Dielectric Polarizer for Polarization Control of Surface-Emitting Lasers," Japan J. Appl. Phys. vol. 33 (1994) pp. L227-L229, Part 2, No. 2B, Feb. 15, 1994.

Tu, Li-Wei et al., "Transparent conductive metal-oxide contacts in vertical-injection top-emitting quantum well lasers", Appl. Phys. Lett. 58 (8) Feb. 25, 1991, pp. 790-792.

Wieder, H.H., "Fermi level and surface barrier of $Ga_xIn_{1-x}As$ alloys," Applied Physics Letters, vol. 38, No. 3, pp. 170-171, Feb. 1, 1981.

Wipiejewski, et al., "VCSELs for datacom applications," Invited Paper, Part of the SPIE Conference on Vertical-Cavity Surface-Emitting Lasers III, San Jose, California, SPIE vol. 3627, pp. 14-22, Jan. 1999.

Y. M. Yang et al., "Ultralow Threshold Current Vertical Cavity Surface Emitting Lasers Obtained with Selective Oxidation", *Elect. Lett.*, vol. 31, No. 11, pp. 886-888, May 25, 1995.

Yablonovitch et al., "Photonic Bandgap Structures", *J. Opt. Soc. Am. B.*, vol. 10, No. 2, pp. 283-295, Feb. 1993.

Young et al., "Enhanced Performance of Offset-Gain High Barrier Vertical-Cavity Surface-Emitting Lasers", *IEEE J. Quantum Electron.*, vol. 29, No. 6, pp. 2013-2022, Jun. 1993.

U.S. Appl. No. 09/751,422, filed Dec. 29, 2000, entitled "Resonant Reflector for Use with Optoelectronic Devices".

U.S. Appl. No. 09/751,423, filed Dec. 29, 2000, entitled "Spatially Modulated Reflector for an Optoelectronic Device".

* cited by examiner

ENHANCED LATERAL OXIDATION

BACKGROUND

The invention pertains to laser light sources and particularly to vertical cavity surface emitting lasers. More particularly, the invention pertains to long wavelength lasers.

A vertical cavity surface emitting laser (VCSEL) may include a first distributed Bragg reflector (DBR), also referred to as a mirror stack, formed on top of a substrate by semiconductor manufacturing techniques, an active region formed on top of the first mirror stack, and a second mirror stack formed on top of the active region. The VCSEL may be driven by a current forced through the active region, typically achieved by providing a first contact on the reverse side of the substrate and a second contact on top of the second mirror stack. The first contact may instead be on top of the first mirror stack in a coplanar arrangement.

VCSEL mirror stacks are generally formed of multiple pairs of layers often referred to as mirror pairs. The pairs of layers are formed of a material system generally consisting of two materials having different indices of refraction and being easily lattice matched to the other portions of the VCSEL. For example, a GaAs based VCSEL may commonly use an AlAs/GaAs or AlAs/AlGaAs material system where the refractive index of each layer of a pair may be changed by altering the aluminum content in the layers. In some devices, the number of mirror pairs per stack may range from 20 to 60 to achieve a high percentage of reflectivity, depending on the difference between the refractive indices of the layers. A larger number of pairs increases the percentage of reflected light.

In many VCSELS, conventional material systems may perform adequately. However, new products are being developed requiring VCSELs which emit light having long wavelengths. VCSELs emitting light having a long wavelength ate of great interest in the optical telecommunications industry because of a low fiber dispersion at 1310 nanometers (nm) and a low fiber loss at 1550 nm. As an example, a long wavelength VCSEL may-be obtained by using a VCSEL having an InGaAs/InGaAsP (or InAlGaAs) active region. When an InGaAs/InGaAsP active region is used, an InP/InGaAsP (or InAlGaAs/InAlAs or InAlGaAs/InP) material system should be used for the mirror stacks in order to achieve a lattice match to the InP substrate. The lattice matching between the substrate and the layers should be substantially close to ensure a true single crystal film or layer growth.

In the InP material based system, it is difficult to achieve a suitable monolithic DBR-based mirror structure having a reasonable thickness because of the insignificant difference in the refractive indices in this material system. As a result, many layers, or mirror pairs, are needed in order to achieve a useful reflectivity. Useful reflectivity may be 99.8 percent or greater. Numerous attempts have been made to address the problem of very thick mirror structures. One attempt included a wafer bonding technique in which a DBR mirror is grown on a separate substrate and bonded to the active region. This technique has had only limited success and also the interface defects density in the wafer fusion procedure may cause potential reliability problems. Other approaches to making satisfactory long wavelength VCSELs have been fraught with one problem or another. For instance, lattice matched InP based mirrors used for 1550 nm VCSELs may have a host of problems in growth, processing, and optical performance. The low index contrast of (or InAlGaAs) and InP (or InAlAs) tends to lead to a requirement of extremely thick (ten microns or thicker) DBRs of 45 or more mirror periods or layer pairs. The AlGaAsSb or AlGaPSb systems associated with an InP substrate may be difficult to grow by MOCVD; and for good contrast, may still require at least 25 mirror pairs to achieve adequate reflectivity for VCSEL operation. For some VCSEL structures, such as the long wavelength structures, current confinement is an important characteristic. Proton implantation and lateral oxidation have been developed and used for current confinement in vertical cavity surface emitting lasers (VCSELs) especially for GaAs-based VCSELs. For some VCSELs, however, proton implantation and lateral oxidation cannot be easily applicable due to either very thick top DBR stacks for proton implantation or lack of lattice-matched high aluminum containing material for oxidation. This appears to be the case of InP related materials for long wavelength VCSEL operation. For InP based material systems, since index contrasts are relatively small as compared to GaAs based counterparts, the DBR stacks tend to be much thicker to obtain reasonable reflectivity from the DBRs. Consequently, a huge amount of energy may be required for gain guide proton implantation of these stacks, which appears to be not practical. Such high energy may damage other parts of the VCSEL structure. Thus, lateral oxidation seems to be a necessary approach for a gain guide for current confinement and possibly optical confinement, and for device isolation. However, the aluminum content is significantly lower in materials lattice matched to InP substrates than those materials lattice matched to GaAs substrates, which makes lateral oxidation difficult. Thus, a solution to the difficulty of lateral oxidation in InP based structures is needed. The invention provides a solution.

SUMMARY

The invention may involve a vertical cavity surface emitting laser-having an InP substrate, a first mirror situated on the substrate, an active region situated on the first mirror, a gain guide formed on the active region and a second mirror situated on the gain guide. The gain guide may be an oxidized layer in the vicinity of the bottom portion of the second mirror proximate to the active region.

A gain guide layer may be initially grown or deposited as a layer containing some aluminum, and then oxidized. In the InP based system, the aluminum content of an acceptable material for a layer in the mirror may be about 52 percent. In the GaAs based system such acceptable material would have about 97 to 98 percent of aluminum content. The GaAs based layer may be relatively easy to oxidize. The oxidation of such layer may be done laterally along the side of the device via a trench around the top mirror plus possibly the active region and bottom mirror, or vertical or other kinds of trenches inserted through a surface of the device. The oxidizable layer in the InP system may similarly be oxidized. However, because of the significantly lower aluminum content, that layer may be much more difficult to oxidize. The difficult process of lateral oxidation of the InP based oxidizable layer may be eased by intentional oxygen incorporation. The oxygen, a water vapor, or other fluid containing oxygen may be used an oxidizing or diffusing agent that is inserted into the oxidizing environment and/or layer containing aluminum to oxidize the latter. The term "fluid" may be a generic term which includes liquids and gases as species. For instance, water, air, and steam may be fluids.

DESCRIPTION

Figure 1:
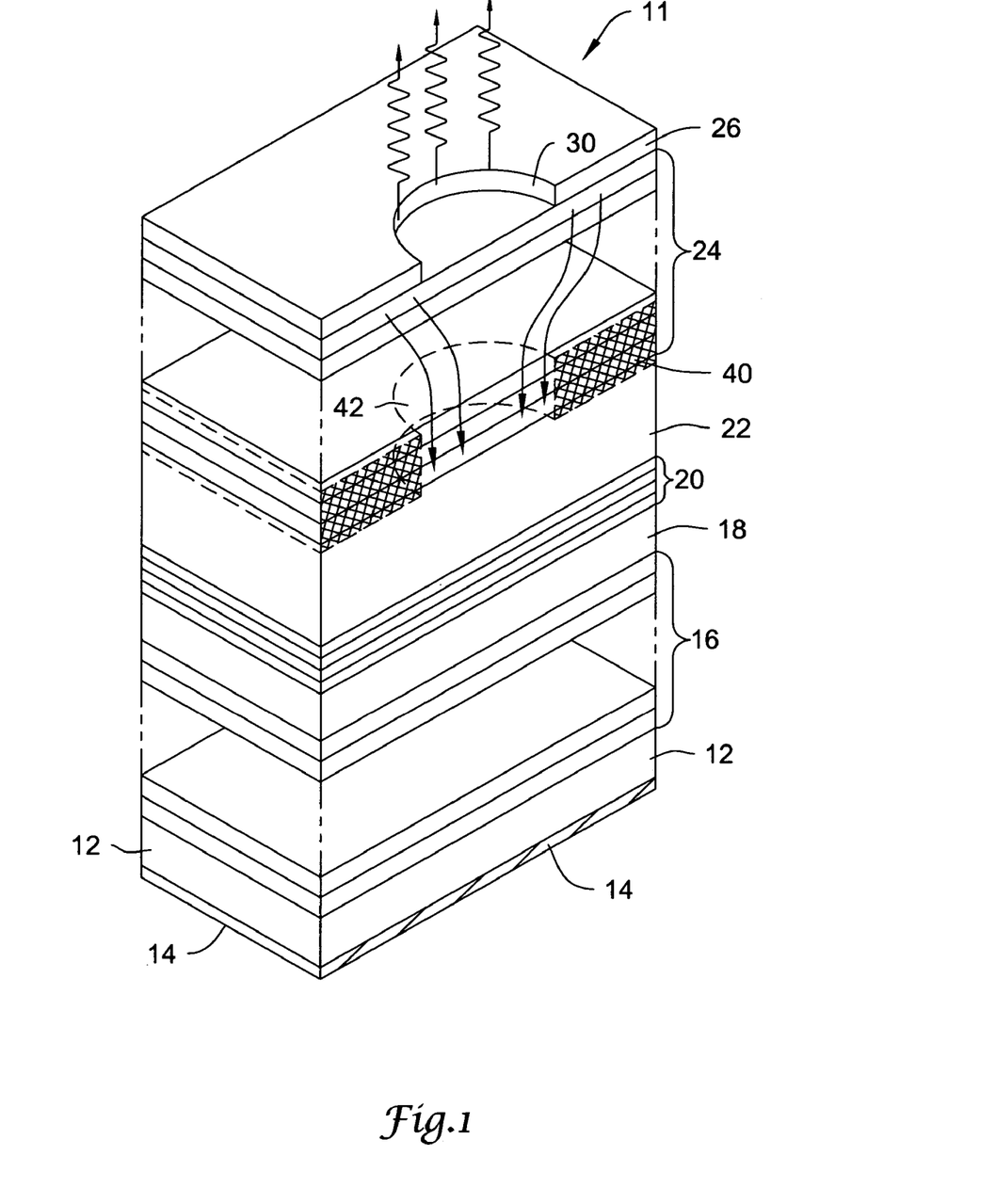
FIG. 1 illustrates a vertical cavity surface emitting laser.

FIG. 1 is a representation showing a perspective illustration of a structure for a vertical cavity surface emitting laser 11. A substrate 12 may be disposed on an electrical contact 14. A first mirror stack 16 and a bottom graded index region 18 may be progressively disposed, in layers, on substrate 12. A quantum well active region 20 may be formed and a top graded index region 22 may be disposed over active region 20. A top mirror stack 24 may be formed over the active region and a conductivity layer 26 may form an electrical contact. Current may flow from upper contact 26 to lower contact 14. This current may pass through active region 20. Upward arrows in FIG. 1 illustrate the passage of light through an aperture 30 in upper contact 26. The downward arrows illustrate the passage of current downward from upper contact 26 through upper mirror stack 24 and the active region 20. An ion (proton) implantation 40 may form an annular region of electrically resistant material. A central opening 42 of electrically conductive material may remain undamaged during the ion (proton) implantation process. As a result, current passing from upper contact 26 to lower contact 14 may be forced to flow through conductive opening 42 and thereby be selectively directed to pass through a preselected portion of active region 20. The current may flow through bottom mirror stack 16 and substrate 12 to lower contact 14. The current going through active region 20 may result in a generation of light within a cavity constituted between top and bottom mirrors 16 and 24. Light may be eventually emitted by structure 11 out of aperture 30 as shown by the upward pointing arrows.

Figure 2:
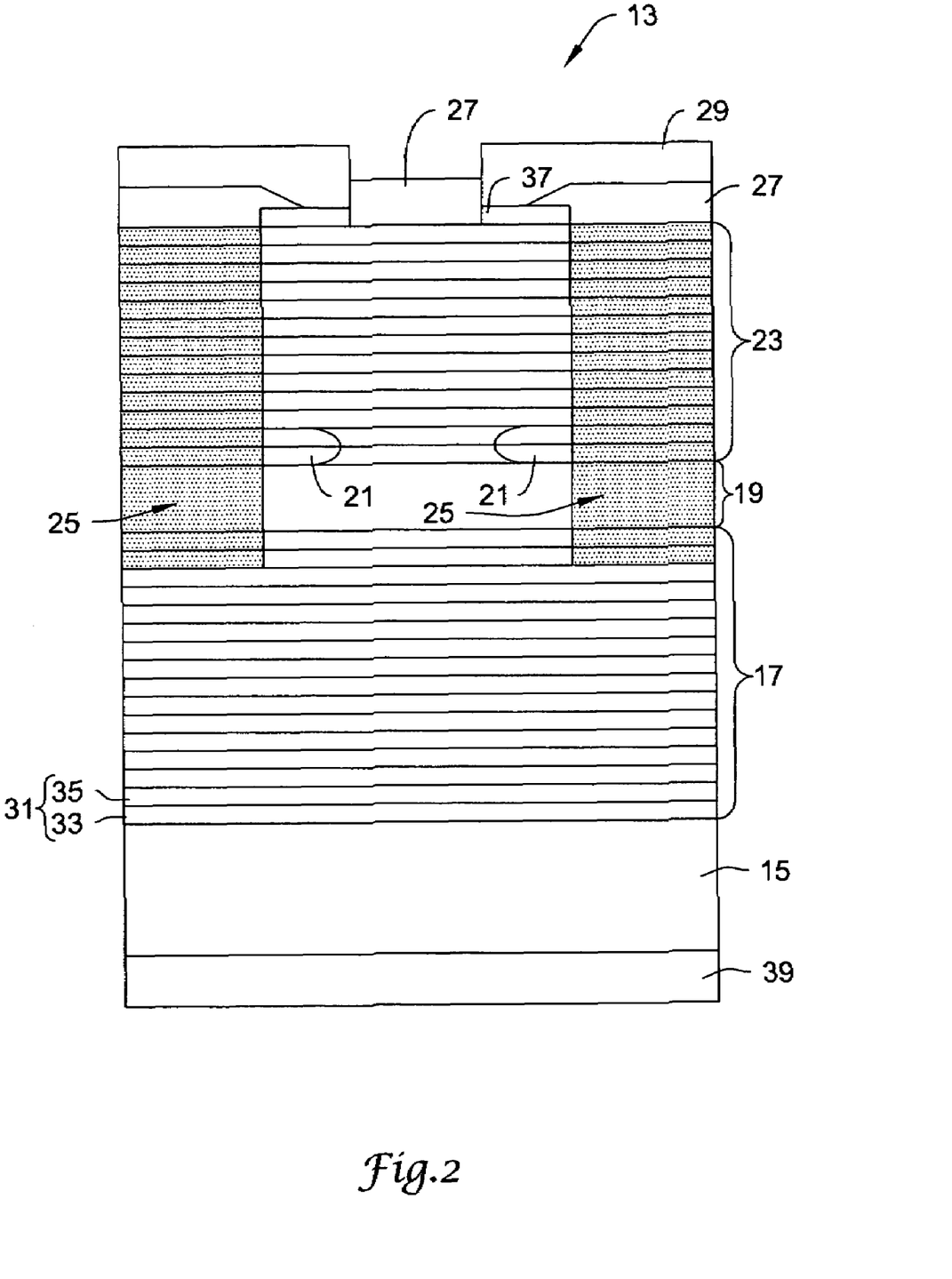
FIG. 2 reveals an illustrative example of a long wavelength VCSEL.
Figure 3:
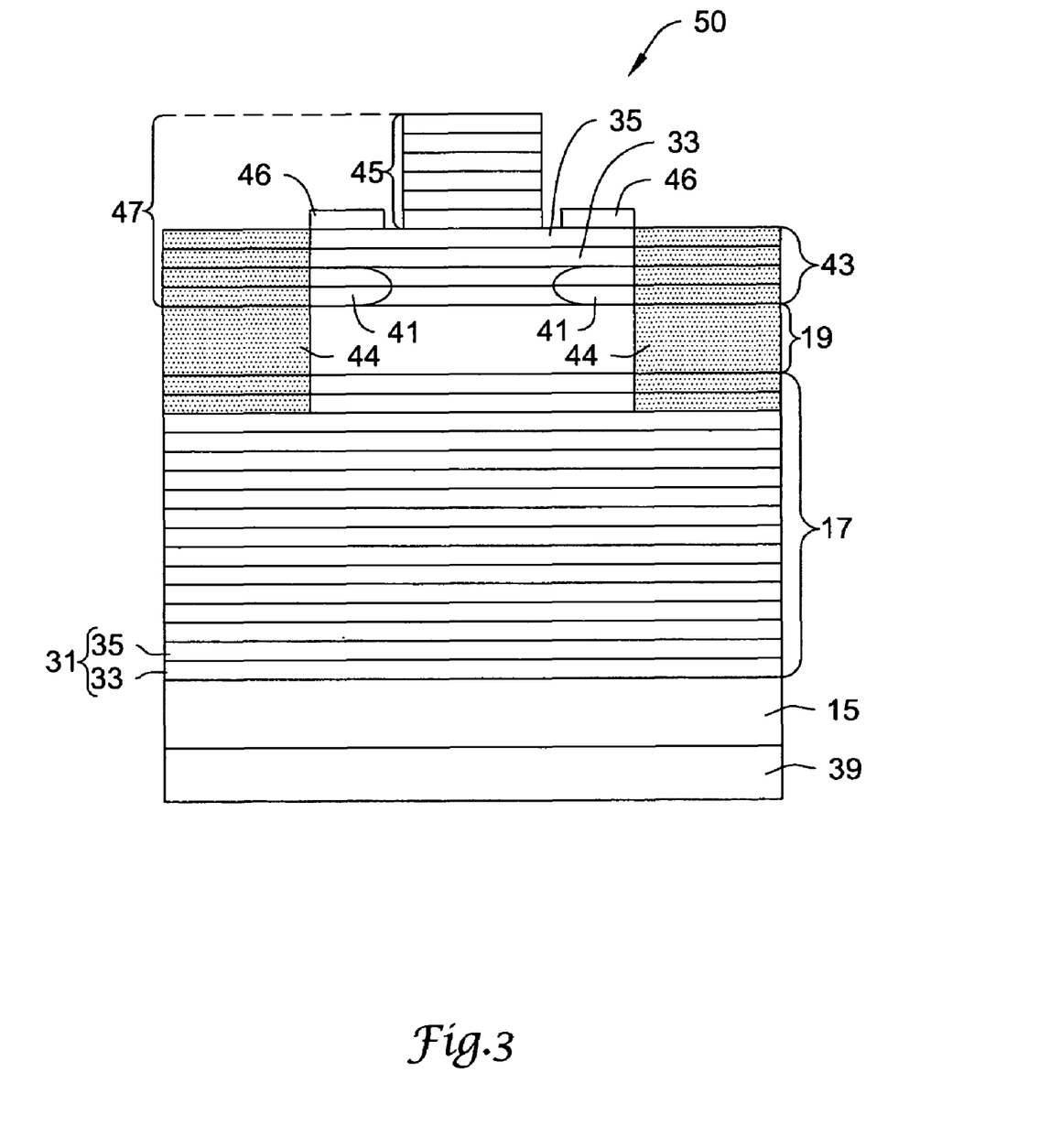
FIG. 3 reveals an illustrative example of a long wavelength VCSEL having a two part top mirror.

FIGS. 2 and 3 reveal several illustrative examples of long wavelength InP based VCSEL structures. A long wavelength may range from about 1200 nm through about 1800 nm. FIGS. 2 and 3 are not necessarily drawn to scale. Structure 13 of FIG. 2 may be a full epitaxial proton implantation version. It may have an InP substrate 15. On substrate may be formed a lower or bottom mirror 17. Mirror 17 may be a distributed Bragg reflector (DBR) having a stack of pairs 31 of layers 33 and 35 of materials. Each pair 31 may be one-half wavelength thick. Each of the layers 33 and 35 may be one-fourth wavelength thick. The thicknesses may be optical wavelengths of the light emitted from structure 13, for the respective materials of layers 33 and 35. The two layers, 33 and 35, of each pair 31 may be composed of different materials. For example, layer 33 may be InAlGaAs and layer 35 may be InAlAs. These layers and pairs may be repeated in a mirror stack. Other pairs of materials for layers 33 and 35 may include InGaAsP and InP, InAlGaAs and InP, GaAsSb and AlAsSb, and GaAsSb and InP, respectively. There may also be other material pairs that may be appropriate for making DBR mirror 17.

Situated on bottom mirror 17, may be formed an active region or cavity 19. Region 19 may have between one and more than five quantum wells. The material for the active region may be InGaAs (or InAlGaAs with low Al content) for quantum wells and InAlGaAs with high Al content for barriers. On active region 19 may be formed an upper or top mirror 23. DBR mirror 23 may have the same structure of pairs 31 of layers 33 and 35 as that in bottom mirror 17.

Proton implantation may be applied at the lower part of mirror 23 to make a gain guide 21 to provide current guidance and confinement in VCSEL structure 13. A center portion on the top of mirror 23 may be masked with a material resistant to proton implantation. Then a proton implantation may be applied to the top of structure 13 resulting in an isolation 25. Since the indexes of refraction of each material of the pairs of layers are close to each other, then many more pairs 31 may be required to build the mirror with the needed 99.8 percent reflectivity. Consequently, top mirror is a quite thick epitaxial DBR. Thus, rather high energy is required to achieve proton implantation down far enough in mirror 23 to result in an effective isolation 25.

The mask may be removed from the central portion of top mirror 23. Another mask may be applied to the top mirror 23 with an opening for applying a contact metal 37 on the top of mirror 23. Structure 13 may be moved so the resultant contact metal 37 may be in the form of a ring. The mask may be removed after deposition for the contact metal 37. Another mask may be placed on a portion of the contact metal and a passivation layer 27 may be deposited on the top of structure 13. The mask may be removed and another mask may be formed on the center portion of passivation layer 27. A layer of contact metal may be applied on the masked top of structure 13. The mask from the center portion of passivation layer may be removed with the remaining contact metal resulting in a ring-like contact 29 connected to contact metal 37. Contact metal may be deposited on the bottom side of substrate 15 to result in a second contact 39 for VCSEL structure 13.

FIG. 3 shows a VCSEL structure 50 which may a regarded as a hybrid proton implantation version. As like structure 13 of FIG. 2, a mirror 17 may be formed on an InP substrate 15. The structure and materials used in the pairs 31 of layers 33 and 35 may be the same as those in structure 13. An active region on cavity 19, like that of structure 13, may be formed on mirror 17. On cavity 19, a first part 43 of mirror 47 may be formed on active layer or cavity 19. The material of pairs 31 of mirror part 43 may be the same as the pairs of bottom mirror 17 of this structure 50. Mirror part 43 may have fewer pairs 31 of layers 33 and 35 than bottom mirror 17 of this structure 50 or top mirror 23 of structure 13. One reason for the shorter mirror stack 43 may be to effect a proton implantation that results in an isolation 44 requiring much less energy than the proton implantation required for making isolation 25 in structure 13. Proton implantation may be applied in a lower portion of mirror part 43 to make a gain guide 41 to provide current guidance and confinement in VCSEL structure 50.

On mirror part 43, another mirror part 45 may be formed. Mirror parts 43 and 45 constitute upper DBR mirror 47. Mirror part 45 is a dielectric mirror stack (DBR) that may be like a mesa or an island situated on lower mirror part or portion 43 of upper mirror 47. Mirror stack 45 may have, as examples, 3 to 4 pairs of $TiO_2$ and $SiO_2$, 2 to 3 pairs of Si and $Al_2O_3$, or 4 to 5 pairs of $TiO_2$ and $Al_2O_3$, respectively.

The dielectric stack may cover the light aperture of VCSEL structure 50 and not block emitted light.

Formed around dielectric stack 45 may be a ring of contact metal as a first contact 46 for VCSEL structure 50. Contact 46 may be deposited in a manner similar to that of contact 37 for structure 13. A second contact metal may be deposited on the bottom of InP substrate 15 as a second contact 39 for VCSEL structure 50. A disadvantage of structure 50 is the process for making it is complicated by the making of stack 45 and related issues such as, for instance, stress in dielectric DBR stack 45.

Figure 4:
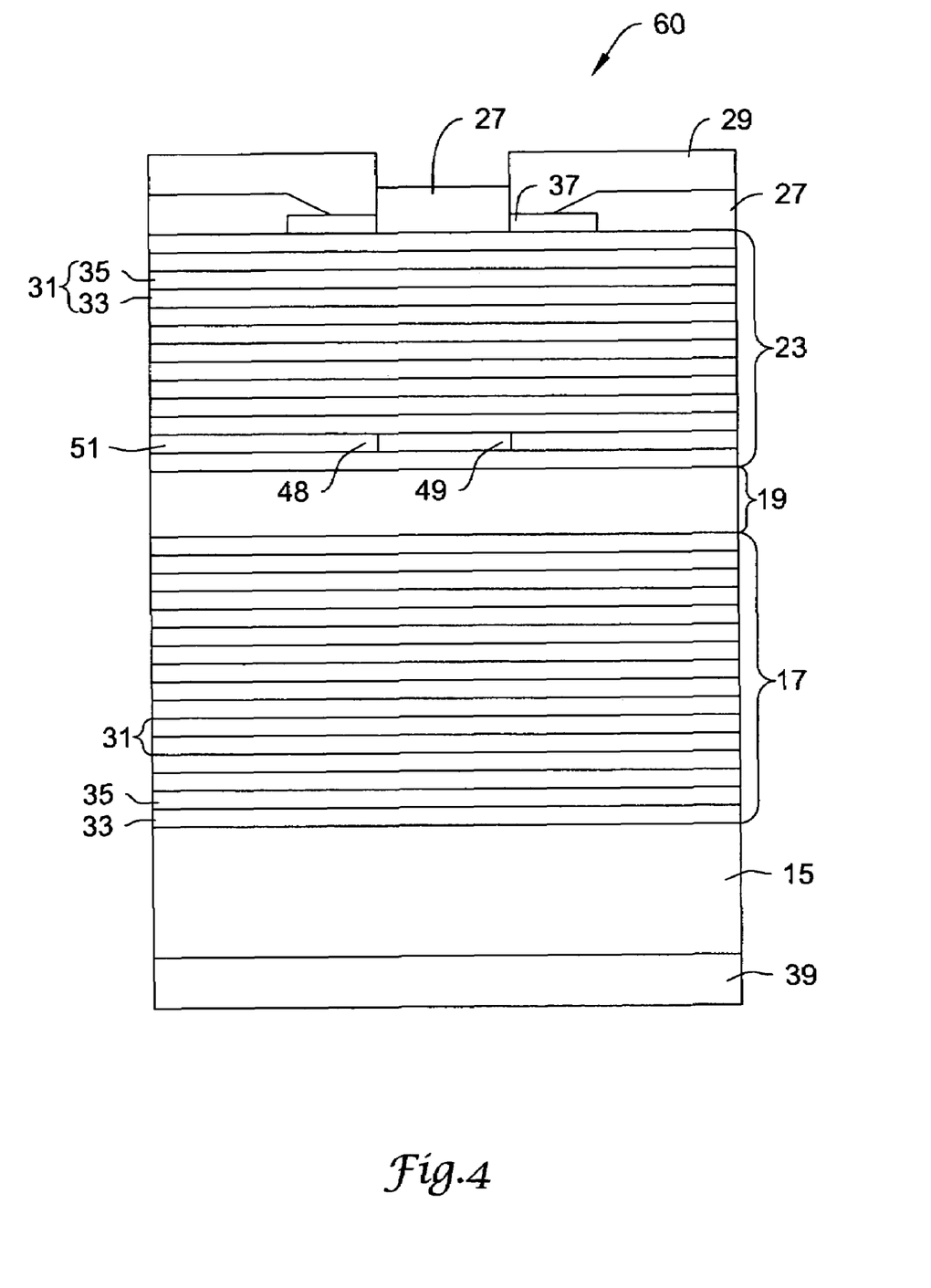
FIG. 4 shows a structure of a VCSEL incorporating an enhanced oxidized layer approach.

FIG. 4 shows VCSEL structure 60 which may be regarded as a full epitaxial oxide version. Lateral oxidation in upper mirror 23 may be resorted to for isolation and current confinement. On InP substrate 15, a lower DBR mirror 17 may be formed. Mirror 17 may have a stack of pairs 31 of layers 33 and 35 having material like that of mirror 17 in structure 13 of FIG. 2. An active region or cavity 19 may be formed on bottom DBR mirror 17. Active region 19 may have one to more than five quantum wells. The material of active region 19 may include material similar to that of region 19 in structure 13. A top mirror 23 may be formed on active region or cavity 19. Mirror 23 may have a structure of pairs 31 of layers of material like that of mirror 23 in structure 13.

Figure 5:
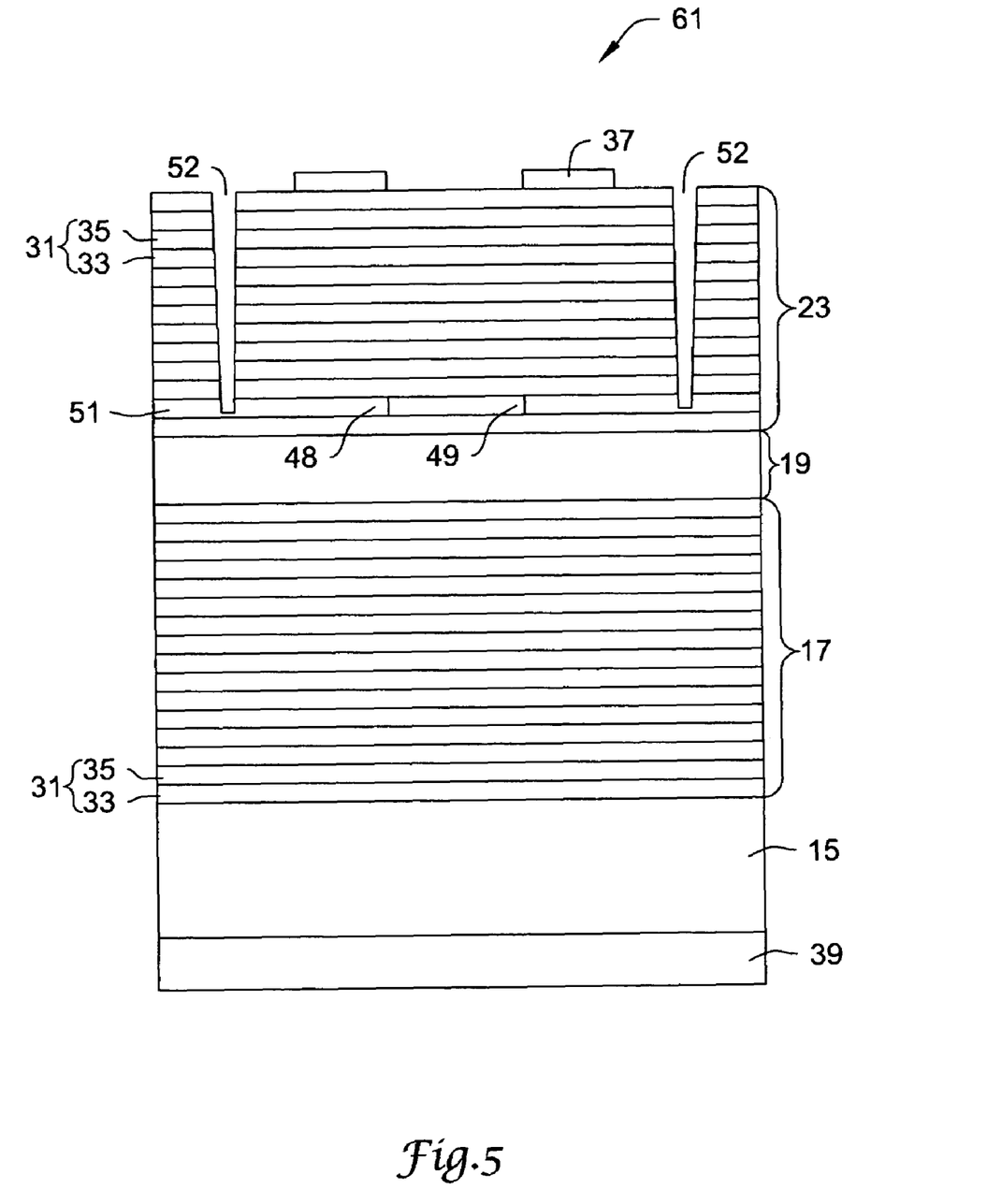
FIG. 5 shows the structure of FIG. 4 with trenches.

A thing about structure 60 that is different from structure 13 is that one or two of the layers of a pair 31, near active region 19 in mirror 23, may have a high content of aluminum. Such layers or layer having a high content of aluminum may be designated as layer 51. Layer 51 may instead be a layer or layers between top mirror 23 and active region 19. In other words, this layer 51 is oxidizable and may be oxidized laterally from the layer's external edge or via a vertical or isolation trench under certain environmental conditions having, for example, oxygen or high water vapor and high temperature. FIG. 5 shows an illustrative example of vertical trenches 52 for a structure 61, which is similar to structure 60. The result may be lateral oxidation 48 of layer 51 forming a gain guide 49 and providing isolation for VCSEL structures 60 and 61. Isolation 25 and a gain guide 21 as provided by proton implantation in structure 13 may be absent in structures 60 and 61.

Contact metal 37 and passivation layer 27 are formed on the top of upper DBR mirror 23 of structure 60 in the same manner as it is formed for structure 13. An electrical contact 29, connected to contact metal 37, may be made in the same manner as that for structure 13. Structure 61 of FIG. 5 does not show electrical contact 29 or passivation layer 27. If those items were present, then trenches 52 may go through them. Contact material may be deposited on the bottom of InP substrate 15 to provide a second electrical contact for VCSEL structure 60. One apparent disadvantage relative to making the long wavelength structure 60 version may be a lack of speed in producing an appropriate lateral oxidation 48 to provide the desired gain guide 49, because of the low content of aluminum in oxidizable layer 51. The present invention circumvents that disadvantage.

By the way, the temperature for oxidation may be about 350 to 400 degrees C. in the case of lateral oxidation for a GaAs-based VCSEL. The oxidation temperature may be about 500 degrees C. for an InP-based VCSEL. The latter high temperature would not necessarily affect the other layers.

To make a layer easily oxidize laterally, the layer should contain a high aluminum concentration. A nearly lattice matched AlGaAs (Al=0.97 to 0.98) layer may normally be used for an oxidation layer for GaAs based VCSELs. In the case of InP based VCSELs, however, a nearly lattice-matched high aluminum containing layer is not available. However, a low aluminum containing material, InAlAs (Al=0.52), having a sufficient lattice matching characteristic, may be used in oxidation layer 51 on an InP based VCSEL. Under ordinary conditions, the latent lateral oxidation of InAlAs may take an extended time at a high oxidation temperature, which could cause other problems, such as quantum well mixing and diffusion of a mobile dopant. The InAlAs of oxidizable layer 51 may change to $Al_xO_{1-x}$ when being oxidized.

The present enhanced oxidation may be effected in the following way. First, there may be diffusion of an oxidizing agent (e.g., water vapor or oxygen) into layer 51 via an oxide/semiconductor interface or edge, or trench. Second, a chemical reaction (i.e., oxidation) may be initiated. A release of byproducts as a result of this oxidation or diffusion of the oxidizing agent may occur. But these byproducts may be absorbed, so generally there is little concern about them during the diffusion or oxidation. If diffusion of an oxidizing agent (i.e., $O_2$ or $H_2O$) is one of the rate controlling steps and oxidizing agents are already present in the layer, the lateral oxidation rate may be increased for a low Al-containing layer such as layer 51. Lateral oxidation rates may be small for InP system materials having aluminum.

Oxygen may be incorporated intentionally for enhanced lateral oxidation 48 of layer 51. Such oxygen incorporation may be carried out by with intentional oxygen doping of layer 51 with an oxygen-containing metalorganic dopant. Lowering the growth temperature of layer 51 may enable more oxygen to be put into that layer. This may make layer 51 oxidation a quicker process.

The proof of this enhanced oxidation process for low aluminum containing layer 51 may be shown by an oxidation sample that was grown after a metalorganic chemical vapor deposition (MOVCD) chamber was opened up for regular maintenance which permitted additional oxygen and water vapor to enter the chamber. It was previously known that for a certain period of time, the chamber was expected to have a certain amount residual oxygen and water vapor. A sample like layer 51 was laterally oxidized in an oxidation process in the chamber. A much faster oxidation rate (7 to 10 micron lateral oxidation) than expected of the sample was observed. The faster rate turned out to be due to a greater amount of oxygen and water vapor in the chamber than the residual amount. The oxygen level of this sample was investigated with SIMS (Secondary Ion Mass Spectroscopy) and the sample was revealed to contain a high oxygen level (greater than the 10E19 order). The normal oxygen level of such sample oxidized under previous chamber conditions would have been in about the 10E16–17 order. Thus, the increasing the amount of oxygen in the oxidization environment or oxidation chamber of the sample or layer 51 may increase lateral oxidation rate of that sample or layer. Further, doping layer 51 with oxygen or vapor also may increase lateral oxidation rate of that layer. With either approach, one may cause an enhancement of the lateral oxidation rate by intentional oxygen incorporation even after all of the residual oxygen in the chamber environment of the layer is gone. The oxygen may be introduced in various fluids such as water vapor or in dopants of one kind or another.

Oxygen or water may be allowed to enter or purposely be placed into film or layer 51 during the growth of structure 60. Generally, one may avoid vapor entering into the other layers during that growth. A pre-existing amount of water vapor or oxygen in layer 51 may aid in the increase of the oxidation rate of layer 51 when oxidized.

Figure 6:
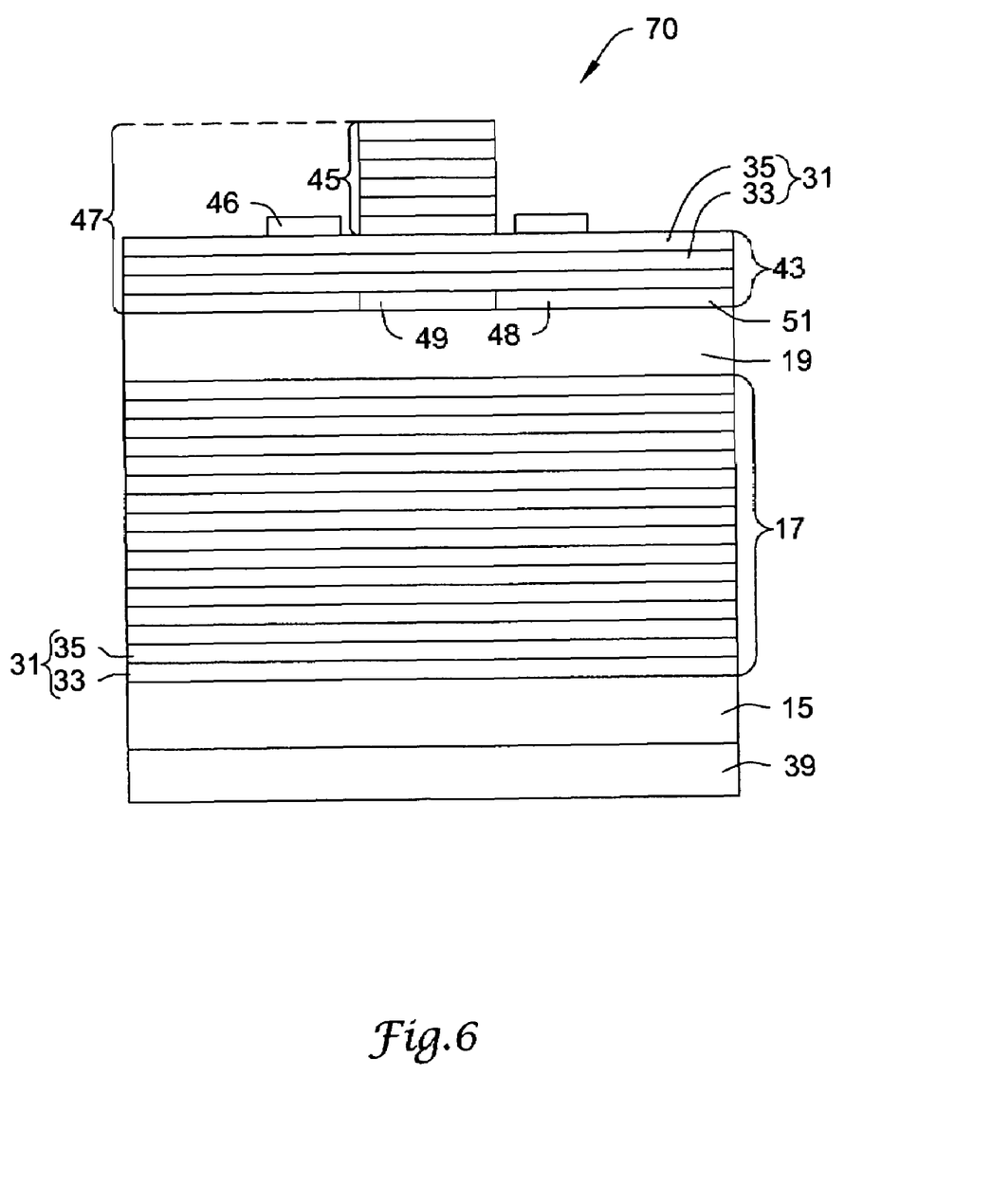
FIG. 6 shows a structure of a VCSEL with a two part top mirror, incorporating an enhanced oxidized layer approach.
Figure 7:
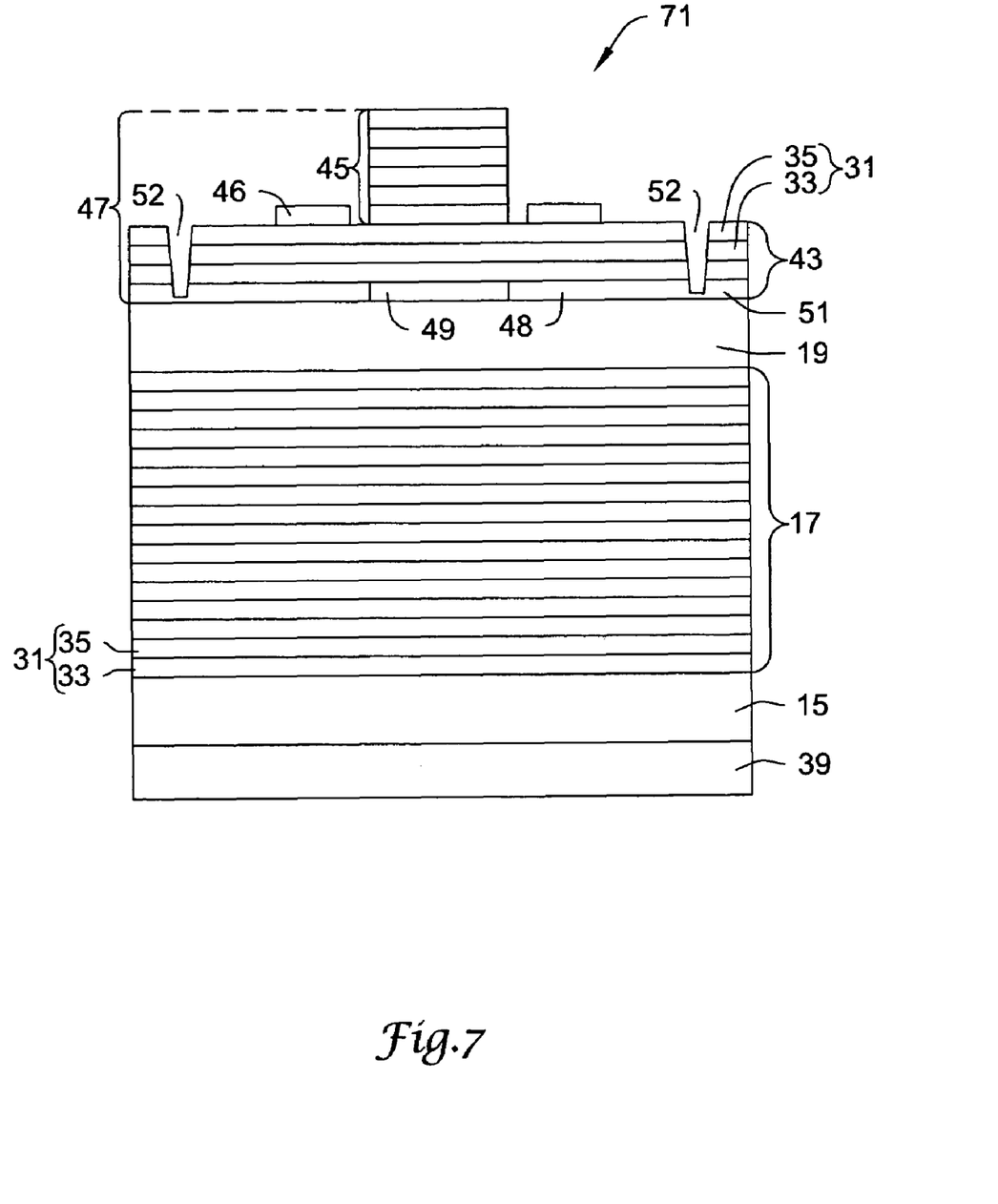
FIG. 7 shows the structure of FIG. 6 with trenches.

FIG. 6 shows a structure 70 that is similar to structure 50 of FIG. 3. A thing about structure 70 that is different from structure 50 is that one or two of the layers of a pair 31, near active region 19 in mirror portion 43, may have a high content of aluminum. Such layers or layer having a high content of aluminum may be designated as layer 51. Layer 51 may instead be a layer or layers between mirror portion 43 and active region 19. In other words, this layer 51 is oxidizable and may be oxidized laterally from the layer's external edge or via a vertical or isolation trench under certain environmental conditions having, for example, oxygen or high water vapor and high temperature. FIG. 7 shows an illustrative example of vertical trenches 52 for a structure 71, which is similar to structure 70. The result may be lateral oxidation 48 of layer 51 forming a gain guide 49 and providing isolation for VCSEL structure 70 or 71. Isolation 44 and a gain guide 41 as provided by proton implantation in structure 50 of FIG. 3 may be absent in structures 70 and 71.

Figure 8:
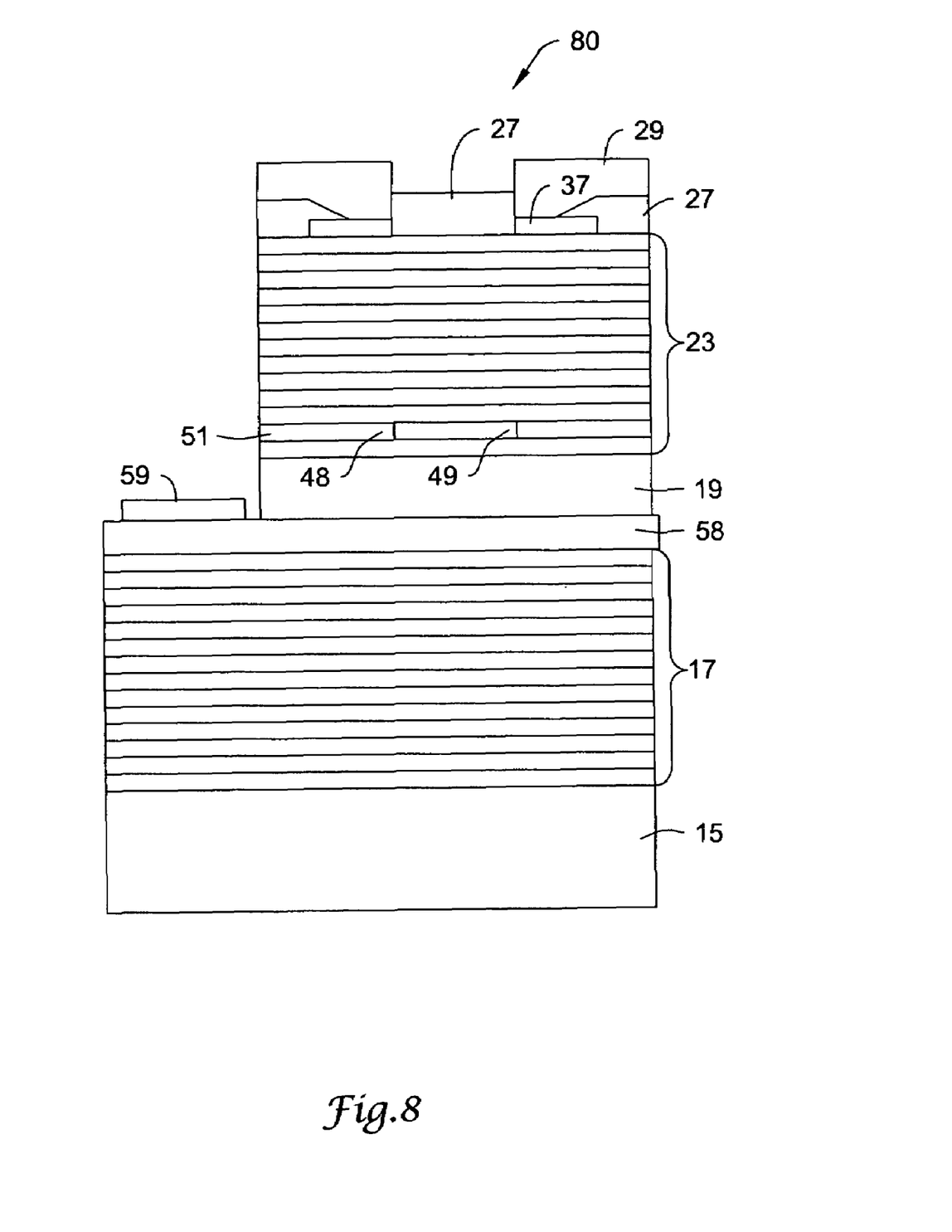
FIG. 8 shows a structure similar to that of FIG. 4 having a coplanar configuration.
Figure 9:
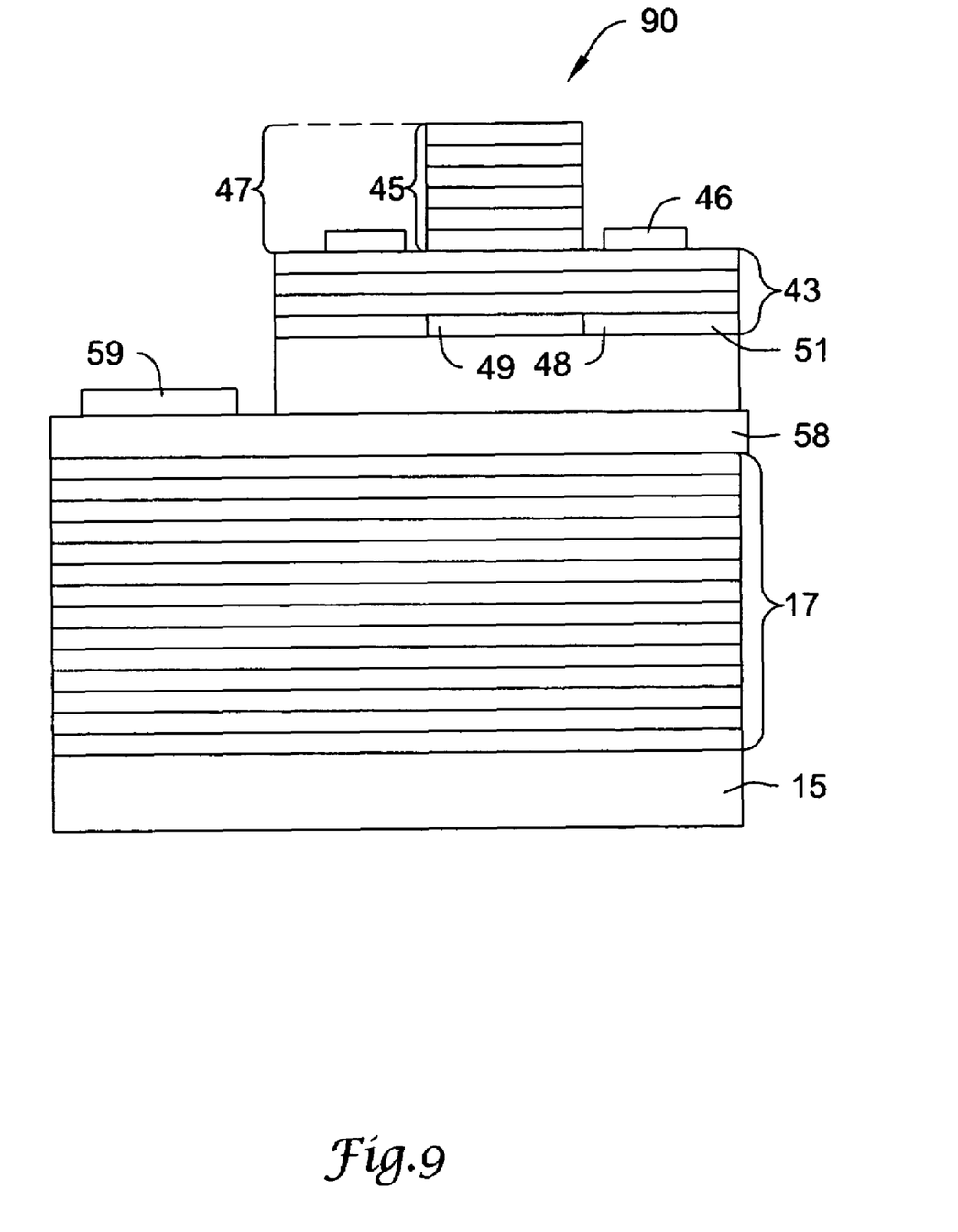
FIG. 9 shows a structure similar to that of FIG. 6 having a coplanar configuration.

Structures 60, 61, 70 and 71 may instead have coplanar configurations 80 and 90, shown in FIGS. 8 and 9, respectively, with or without trenches 52, having a second contact 59 in lieu of contact 39. Contact 59 may be situated on an intra cavity contact layer 58 which is situated on the top of lower mirror 17 and extending out beyond an edge of upper mirror 23 or 47, respectively. Structures 60, 61, 70, 71, 80 and 90 may have a configuration where top mirror 23 and 47, respectively, may be a mesa or island situated on the lower portion of the VCSEL structure.

Besides the use of the invention for InP based systems, there may be reasons for increasing the lateral oxidation of the oxidizable layer in the GaAs based material system such as the need to lower the oxidization temperature or to speed up the oxidation of the confinement and/or isolation layer, or to protect other elements of the system or device.

Although the invention has been described with respect to at least one illustrative embodiment, many variations and modifications will become apparent to those skilled in the art upon reading the present specification. It is therefore the intention that the appended claims be interpreted as broadly as possible in view of the prior art to include all such variations and modifications.

What is claimed is:

1. A semiconductor laser device comprising:
   a first mirror;
   an active layer situated on said first mirror;
   an oxidizable layer situated on said active layer;
   a second mirror situated on said oxidizable layer; and
   wherein said oxidizable layer comprises a material with oxygen, and wherein said first mirror has at least one trench from an outside surface of said first mirror into said oxidizable layer.

2. A semiconductor laser device comprising:
   a first mirror;
   an active layer situated on said first mirror;
   an oxidizable layer situated on said active layer, the oxidizable layer comprising a material with oxygen;
   a second mirror situated on said oxidizable layer; and
   wherein said first mirror has at least one trench from an outside surface of said first mirror into said oxidizable layer, and wherein a fluid having oxygen is conveyed into the at least one trench to oxidize a first portion of said oxidizable layer; and wherein a second portion of said oxidizable layer is an aperture.

3. The device of claim 2, wherein the aperture is for guiding current.

4. The device of claim 3, wherein the semiconductor device is an InP based VCSEL.

5. The device of claim 4, wherein said oxidizable layer comprises InAlAs.

6. A semiconductor laser device comprising:
   a first reflector stack;
   an active region situated on said first reflector stack;
   a second reflector stack situated on said active region; and
   wherein said second reflector stack comprises at least one layer having a first portion oxidized with an oxidizing agent having a fluid with oxygen, and wherein the first oxidized portion of the at least one layer forms a perimeter around an aperture.

7. The device of claim 6, wherein the aperture is for guiding current.

* * * * *